United States Patent [19]

Manniso

[11] Patent Number: 4,557,957
[45] Date of Patent: Dec. 10, 1985

[54] MICROPOROUS METAL-PLATED POLYTETRAFLUOROETHYLENE ARTICLES AND METHOD OF MANUFACTURE

[75] Inventor: James L. Manniso, Newark, Del.

[73] Assignee: W. L. Gore & Associates, Inc., Newark, Del.

[21] Appl. No.: 476,839

[22] Filed: Mar. 18, 1983

[51] Int. Cl.$^4$ .................. F16L 11/04; B32B 15/08; B32B 27/12; B32B 27/32

[52] U.S. Cl. .................. 428/36; 428/212; 428/215; 428/284; 428/289; 428/315.5; 428/315.7; 428/316.6; 428/422; 428/461

[58] Field of Search .......... 428/421, 36, 422, 315.5, 428/315.7, 209, 212, 304.4, 307.7, 215, 461, 284, 289, 316.6; 427/304, 306, 98, 54

[56] References Cited

U.S. PATENT DOCUMENTS

| Re. 29,039 | 11/1976 | Andrews | 427/304 X |
| 3,094,585 | 6/1963 | Rudner | 428/421 X |
| 3,793,060 | 2/1974 | Weininger et al. | 428/315.7 |
| 3,930,109 | 12/1975 | Brandt et al. | 428/422 |
| 3,949,121 | 4/1976 | Kenney | 427/98 |
| 3,956,535 | 5/1976 | Lozier | 427/306 X |
| 3,959,546 | 5/1976 | Polichette et al. | 428/209 |
| 3,959,547 | 5/1976 | Polichette et al. | 428/209 |
| 3,963,841 | 6/1976 | Anschel et al. | 427/304 |
| 4,021,314 | 5/1977 | Dafter, Jr. | 427/306 X |
| 4,084,023 | 4/1978 | Dafter, Jr. | 427/98 |
| 4,150,171 | 4/1979 | Feldstein | 427/54 |
| 4,187,390 | 2/1980 | Gore | 428/315.5 X |
| 4,283,448 | 8/1981 | Bowman | 428/36 |
| 4,344,999 | 8/1982 | Gohlke | 428/212 |

OTHER PUBLICATIONS

W. L. Gore et al., Memo Dated Feb. 26, 1974, pp. 1-2.

Primary Examiner—Thomas J. Herbert
Attorney, Agent, or Firm—Finnegan, Henderson, Farabow, Garrett & Dunner

[57] ABSTRACT

Microporous polytetraflouroethylene (PTFE) articles, having a microstructure of nodes interconnected by fibrils also having continuous interporous metal coatings which encapsulate the nodes and fibrils of the PTFE while maintaining substantial porosity are disclosed, together with a method of producing temporary liquid-filled hydrophilic microporous article resulting in an improved metal plating manufacturing process.

33 Claims, 7 Drawing Figures

MICROPOROUS METAL-PLATED POLYTETRAFLUOROETHYLENE ARTICLES AND METHOD OF MANUFACTURE

BACKGROUND OF THE INVENTION

1. Field of the Invention

The present invention relates to microporous metal-coated articles, preferably polytetrafluoroethylene (PTFE) articles, and a method for manufacturing the articles.

2. Background of the Invention

There has long been a need for a method of obtaining a high quality, adherent conductive metal coating on articles made from polytetrafluoroethylene (PTFE) polymer. However, the same qualities that have provided an impetus to use PTFE, namely, the relative inertness to a wide range of corrosive chemicals and low dielectric constant (good insulator) also have rendered this material extremely difficult to "metallize" using conventional metal plating techniques, and/or can result in products having poor and non-uniform metal coatings. Representative of the prior art concerning metal plating techniques for PTFE are the U.S. Pat. Nos. 4,150,171 to Feldstein and 4,021,314 to Dafter, Jr.

In addition to the problem of creating an adherent coating for PTFE, it is especially difficult to metallize the inner surface area of any porous structure. This characteristic is further affected by a reduction in the size of the porous openings, particularly with miniscule size pores in the order of 10 microns and even as small as 0.1 micron. Representative of prior art dealing with metal plating of porous electroplatable conductive bodies is U.S. Pat. No. 4,204,918 to McIntyre et al.

A recent invention (U.S. Pat. No. 3,953,566) provides a process for manufacturing microporous, high strength, shaped PTFE articles. These articles are characterized by a microstructure of nodes of substantially solid PTFE interconnected by fibrils. Products produced by this process should find wide acceptance in the industrial, medical, and electrical arts, for example, in industrial filter bag filtration art.

SUMMARY OF THE INVENTION

In accordance with the present invention, as embodied and broadly described herein, the metal-coated microporous article of manufacture preferably comprises a microporous polytetrafluoroethylene membrane having a microstructure characterized by nodes, interconnected by fibrils, and a continuous interporous coating of metal, the metal coating substantially encapsulating at least some of the individual nodes and fibrils, wherein at least one surface of the article is metal-coated and wherein at least a portion of volume of the article beneath the one surface is metal-coated.

Preferably, the article has an average pore size less than about 100 um and a porosity of greater than 25% by volume. It is also desireable for the article to be flexible, electrically conductive, hydrophilic, and to have high fluid permeability, an effective surface area greater than 1 m²/gm, and a metal coating that tenaciously encapsulates both nodes and fibrils of the microporous PTFE membrane while maintaining substantial porosity. By effective surface area is meant the surface area which is available for contact throughout the volume by a material as a result of the porous structure. By tenaciously encapsulate is meant adhering or tending to hold strongly to the surfaces of the microporous structure, while substantially enclosing the PTFE structure.

It is also preferred that the article have a bulk density of less than about 10.0 gm/cc, the conductive metal is nickel, and that the thickness of the nickel coating surrounding the nodes and fibrils is about 10 to 1000 Å.

Further in accordance with the present invention as embodied and broadly described herein, it is preferable that the articles of manufacture comprise a microporous first layer, the first layer also being flexible and electrically conductive along at least one layer surface and also from the one surface along a path perpendicular to the one surface through at least a portion of the first layer thickness, the first layer also having a bulk density less than about 10.0 gm/cc; and a second layer contacting the first layer at the surface opposite the one surface.

Preferably, the first layer is a metal-coated thin microporous PTFE membrane having a microstructure characterized by nodes interconnected by fibrils and being conductive through its total thickness and having a thickness of about 0.5 mils, and said second layer is a porous, fabric backing with a thickness of about 10.0 mils, and wherein the fabric backing also is coated with a conductive metal, the fabric backing layer being conductive along its surface opposite the membrane.

It is also preferred that the metal coating on the fiber backing surrounds the individual fibers and the fiber backing is conductive through the entire second layer thickness so that a microporous article of construction is formed, which is comprised of a metal-coated polytetrafluoroethylene microporous membrane, supported by a porous metal-coated fabric backing. Therefore, the layered construction of the articles of manufacture contemplates a structure being microporous (15–0.01 um pores), highly porous (98–50%), flexible, electrically conductive along its exterior surfaces and through its volume, hydrophilic, and highly permeable. The article of the invention has an effective metal-coated surface area greater than 1 m²/gm, and metal coating which tenaciously encapsulates both exterior and interior surfaces without substantially reducing porosity. Table 1 provides additional characterization of metal-coated articles.

Still further in accordance with the present invention, as embodied and broadly described herein, there is included the process for coating microporous polytetrafluoroethylene membrane with conductive metal, the membrane having a microstructure of nodes interconnected with fibrils, and the conductive metal coating substantially surrounding at least some of the fibrils, the coated membrane being conductive along at least one surface and through at least a portion of the membrane volume beneath the one surface, the coated membrane retaining a certain degree of porosity, the process including the sequential steps of cleaning the microporous PTFE substrate through immersion in a liquid solution; displacing, coating, and filling the membrane with an aqueous surfactant; displacing, concentrating, and depositing the membrane by immersion in an aqueous palladium/tin activator solution; immersing the activated membrane in an accelerator to substantially displace the tin portion of the palladium/tin activator; immersing the membrane in a water wash to displace at least a portion of the accelerator; and a final step of electroless plating of the microporous PTFE membrane.

The PTFE microstructure, which is clean and filled with aqueous surfactant or aqueous soluble solvent becomes a temporary liquid-filled hydrophilic membrane. The saturated pore spaces now can serve to facilitate later pore space filling by liquids capable of displacing the initial liquid medium. Therefore, this saturation step enables subsequent displacement by activator and accelerator solutions before the process of coating the membrane with conductive metal. This method of aqueous surfactant or soluble solvent filling of PTFE microporous spaces and subsequent displacement by selected and compatible water soluble liquids has been found to be a most surprising, effective, and useful method for the production of metal-coated microporous PTFE articles.

BRIEF DESCRIPTION OF THE DRAWINGS

The accompanying drawings which are incorporated in and constitute a part of this specification, illustrate one embodiment of the invention and, together with the description, serve to explain the principles of the invention.

Figure 1A:
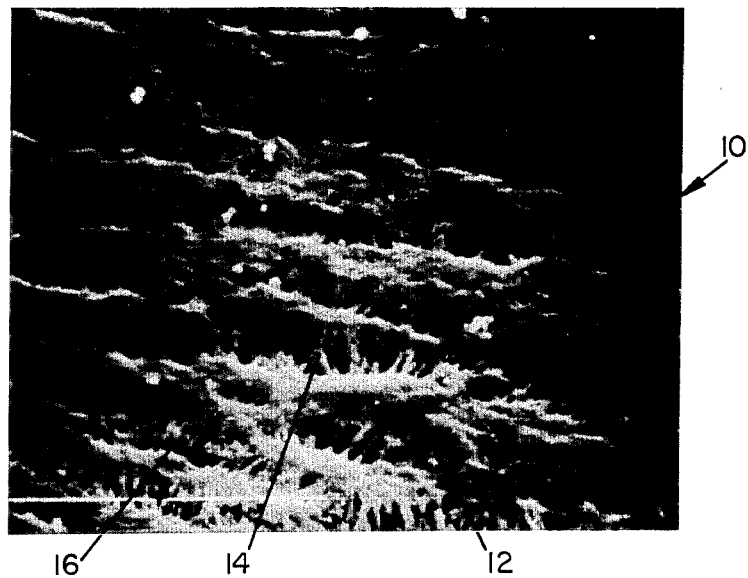
FIG. 1A is a photomicrograph at 5000× magnification, showing the surface of a nickel-plated 0.02 um pore size polytetrafluoroethylene (PTFE) membrane sheet, designated sample A, made in accordance with the present invention.
Figure 1B:
FIG. 1B is a cross section of sample A with a superimposed energy dispersive X-ray analysis in line profile mode indicating relative amounts of nickel penetration.
Figure 2:
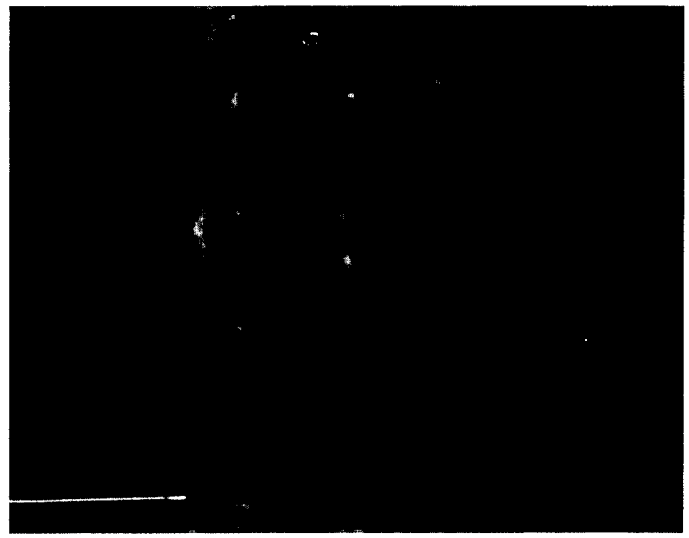
FIG. 2 is a photomicrograph at 500× magnification showing the surface of a nickel-plated 15 um pore size (PTFE) membrane sheet, designated sample B, made in accordance with the present invention.
Figure 4:
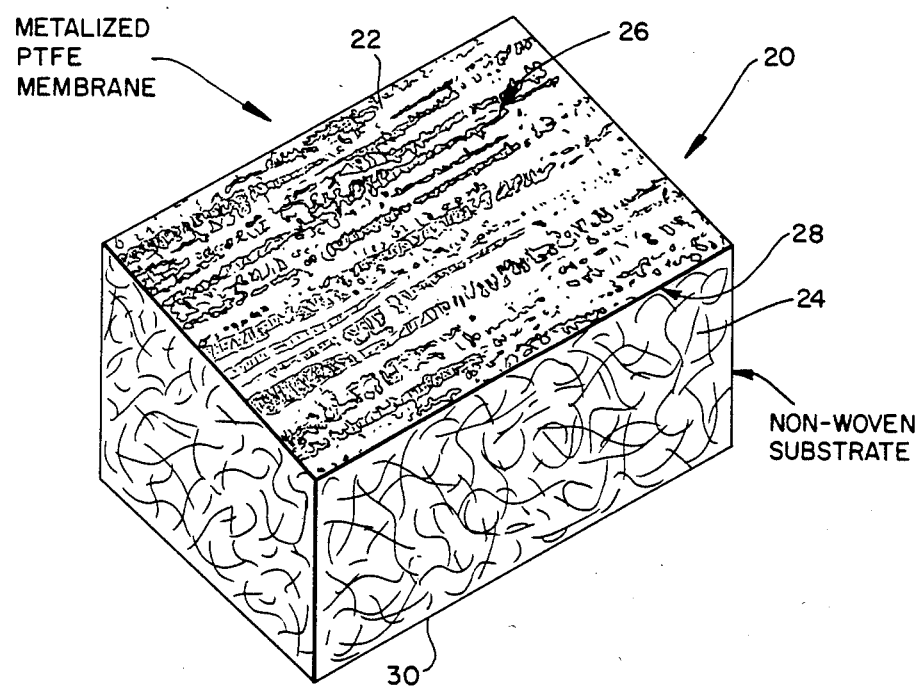
FIG. 4 is a schematic cross section of a layered article including a metalized PTFE layer and a microporous spunbonded polyester non-woven substrate, designated sample C, made in accordance with the present invention.

Table 1 represents coated membrane articles characterization data, comparing metallized membranes as shown in FIG. 1 and FIG. 2 and FIG. 4 with the same non-metallized membranes and layered articles.

DESCRIPTION OF THE PREFERRED EMBODIMENTS

With reference to FIGS. 1A and 1B, and in accordance with the present invention, the conductive microporous article of manufacture of the present invention includes a metal-plated microporous polytetrafluoroethylene (PTFE) membrane wherein the microstructure of the membrane consists of a matrix of PTFE nodes interconnected by PTFE fibrils. FIG. 1A shows the membrane coated with nickel, wherein the basic node and fibril structure of the underlying microporous PTFE membrane can be discerned. U.S. Pat. No. 4,283,448 shows electromicroscopic photographs of uncoated expanded PTFE.

The preferred microporous PTFE membrane material is that disclosed in U.S. Pat. No. 3,953,566 and is produced by rapidly expanding unsintered PTFE. The material used in the article shown in FIG. 1 includes a PTFE membrane approximately 0.003 inches in thickness, and having an average pore size of 0.02 um, a porosity of 50%, and an average bulk density of 1.1 gm/cc. Expanded PTFE material in various forms and with various densities and porosities is available from W. L. Gore & Associates, Inc., P.O. Box 1220, Elkton, MD 21921, and is sold under the trademark GORE-TEX ® Membrane. The particular microporous membrane material used for the article in FIGS. 1A and 1B is sold under the designation 3B1.1.

®GORE-TEX is a trademark of W. L. Gore and Associates, Inc.

The scope of the present invention is not restricted to flat sheets. Microporous polytetrafluoroethylene shapes such as rods, tubes, spheres, etc. can be effectively metal-coated under the invention. Additionally, a number of other plating materials covering a range of porosities have been found to yield metallized articles with some or all of the beneficial characteristics to be discussed hereinafter (see Table 1 and related discussions, infra). Therefore, the scope of the present invention is not restricted to nickel. Metal coatings made of copper, cobalt, silver, gold, platinum, rhodium, etc. can be effectively utilized. Moreover, electroplating in conjunction with electroless plating under the principles of the invention has been found to yield metallized PTFE articles with some or all of the beneficial characteristics contained in the disclosure. Metallized PTFE membranes can also be used in conjunction with a variety of substrates as layered constructions.

Further in accordance with the present invention, the microporous PTFE metal-coated membrane has an interporous metal coating, with the metal coating completely surrounding at least some portion of the individual PTFE fibrils. By interporous is meant that the metal coating in the articles of the present invention is not restricted to the membrane surface but extends into the volume below the surface to a significant extent. This is a surprising and unexpected feature of the present invention, as it renders the article metal-coated not only along the substrate surface, but also along at least a path normal to the surface extending into the article volume, while retaining a significant fraction of the porosity of the original uncoated membrane.

The novelty of this present invention in causing interporous metal coatings to encapsulate both interior and exterior surfaces while maintaining microporosity is contrasted with the teachings in U.S. Pat. No. 4,204,918 where it is taught that "standard electroplating techniques tend to cause a buildup of plating deposit on the exterior surfaces of the porous bodies, especially around and about pore egress sites. This is often serious enough to engender pore blocking".

As embodied herein, the article in FIG. 1A shown generally as 10 depicts the microporous PTFE membrane coated with nickel by an improved electroless plating process to be described hereinafter. FIG. 1A shows nickel-coated nodes 12 and fibrils 14, with interfibril spaces being designated by the numeral 16. A further surprising aspect of the present invention as can be seen in FIG. 1A is that the coating does not take the form of metal lodged in the PTFE matrix spaces, but a true microscopic encapsulation that surrounds and covers the individual nodes 12 and fibrils 14 was formed. The nickel coating thickness in the FIG. 1A microporous membrane article ranges from about 10 to 1000 Å, and the coated membrane average bulk density was about 2.0 gm/cc. The average pore size of the coated membrane shown in FIG. 1A was less than about 0.02 um as determined by electron scanning microscope (ESM).

A cross section shown in FIG. 1B reveals that the metal coating is not just on the exterior surface but has encapsulated fibrils and nodes and has penetrated into the depth but not through to the opposite surface of the microporous PTFE membrane. The superimposed energy dispersive X-ray analysis indicates relative amounts of nickel penetration. The article of FIG. 1A has high surface electrical conductivity but low volumetric conductivity. The extent of electrical conductivity will be more thoroughly addressed throughout the following discussion. Quite apart from the foregoing, the article in FIG. 1A was shown to be water wettable on the metal-coated surface (hydrophilic) and non-water wettable (hydrophobic) on the non metal-coated surface.

The coated membrane article in FIG. 2 is "plated through"; that is, it exhibits an electrically conductive path both along the surface and through the membrane thickness. As uncoated microporous expanded PTFE is an excellent insulator, the nickel coating was shown to be both surface-wise and depth-wise continuous.

The article shown in FIG. 2 reveals that the metal coating is not just on the exterior surface but has encapsulated fibrils and nodes and has penetrated into the depth and through to the opposite exterior surface of the microporous PTFE membrane. The article identified in FIG. 2 had both high surface and volumetric electrical conductivity. In addition, the article of FIG. 2 was shown to be water wettable on both surfaces and throughout the volume of the membrane, thus maintaining a high degree of fluid permeability.

The material used in the article shown in FIG. 2 is a PTFE membrane approximately 0.0005 inches in thickness, and having an average pore size of 15 um, porosity of 98%, and an average bulk density of 0.8 gm/cc. Expanded PTFE material in various forms and with various densities and porosities is available from W. L. Gore & Associates and is sold under the trademark GORE-TEX. The particular microporous membrane material used for the article in FIG. 2 is sold under the designation 1C-1 (0.8/40F).

Figure 3:
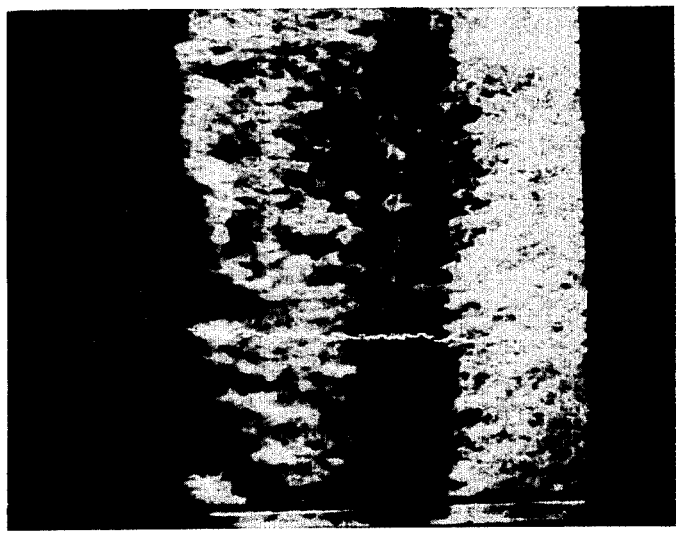
FIG. 3 is a photomicrograph at 150×.65 magnification showing a cross section of a nickel-plated 2.0 um pore size PTFE tube with superimposed energy dispersive X-ray analysis in line profile mode indicating relative amounts of nickel penetration.

The coated membrane article in FIG. 3 is an electroless nickel-plated microporous expanded PTFE tube. The article in FIG. 3 was made from a 0.4724 inch inner diameter by 0.0394 wall thickness microporous expanded PTFE tube having a nominal pore size of 2.0 um. The particular microporous PTFE tube used for the article in FIG. 3 is sold under the designation TA012. A cross section shown in FIG. 3 reveals that the metal coating is not just on the exterior of the outer tubular surface, but has encapsulated fibrils and nodes allowing the coating to penetrate into the depth but not through to the inside surface. With respect to the inside surface, the metal coating is not just on the exterior of the inside surface but has encapsulated fibrils and nodes and has penetrated into the depth but not through to the outside surface. The superimposed energy dispersive X-ray analysis in FIG. 3 indicates relative amounts of nickel penetration. As a result, the article is electrically conductive along its inner and outer surfaces but is not electrically conductive through its volume. The article of FIG. 3 is also water wettable on both the inner and outer metal-coated surfaces (hydrophilic).

For various physical, electrical, and/or chemical reasons, it may also be advantageous to provide a layered article including a conductive microporous layer. For instance, the coated and expanded PTFE article may be a relatively thin membrane which may require a backing layer for support, and such an alternative preferred embodiment is shown schematically in FIG. 4 and designated by the numeral 20.

In accordance with the present invention, the layered article includes a microporous first layer which is flexible and electrically conductive both along one layer surface and through at least a portion of the layer thickness perpendicular to the surface, and has an average bulk density of about 0.8 gm/cc. As embodied herein, the layered article 20 in FIG. 4 includes first layer 22 which is formed of a nickel-coated expanded PTFE membrane material substrate similar to those described previously in relation to FIG. 2. A representative sample (corresponding to item B in table 1) having a pore size of 15 um, and was conductive not only along from free surface 26 but also through the entire membrane layer thickness.

Further in accordance with the present invention, the layered article includes a second layer in contact with the first layer. Thus, as embodied herein, layered article 20 also includes second layer 24 contacting first layer 22 at surface 28. Second layer 22 can be a thin sheet of non-woven polyester scrim fabric which is also coated with nickel, and which also is flexible and electrically conductive both along the sheet surface such as surface 30, and through the sheet thickness.

The presently preferred method of fabricating layered article 20 is to use a laminate of prebonded microporous PTFE membrane and the non-woven fabric sheet, and then to nickel-coat the laminate using the improved coating method to be described hereinafter. Such uncoated laminates are available commercially from W. L. Gore & Associates, Inc. in a variety of thicknesses and PTFE membrane porosities.

However, for certain applications, it may be desirable to have the second layer uncoated or coated in a pattern different from first layer 22, in which case it may be preferable to fabricate layers 22 and 24 separately and then assemble them into contacting relation. In such cases, one of ordinary skill in the art would appreciate that various means would be available for assembling the layers, including mechanical fasteners and chemical bonding agents, depending upon the nature of the surfaces to be contacted. Thus, the scope of the present invention is not intended to be limited by the means or method used to maintain contact between the separate layers.

The coated membrane article in FIG. 4 is layered article comprising a nickel-coated microporous PTFE membrane and a nickel coated microporous spunbonded polyester non-woven substrate. The material used in the article shown in FIG. 4 includes a PTFE membrane approximately 0.0005 inches in thickness and having an average pore size of 15 um, a porosity of 98% and an average bulk density of 0.8 gm/cc. The particular microporous membrane material used for the article in FIG. 4 is sold by W. L. Gore & Associates, Inc. under the designation 1C-1 (0.8/40F). The substrate backing material used in FIG. 4 is a spunbond non-woven polyester material approximately 0.007 inches in thickness, and having an average pore size of 200 um, a porosity of 80% and an average density of 0.16 gm/cc. Spunbond polyester non-woven materials in various densities and porosities are available from E.I. DuPont Company, Inc., Wilmington, DE 19898, and is sold under the trademark ®Reemay. The particular non-woven material used for the article in FIG. 4 is designate ®Remay 2011.

Figure 5A:
FIG. 5A and 5B are photomicrographs at 5000× magnification showing the reduction in pore size after metallizing.
Figure 5B:
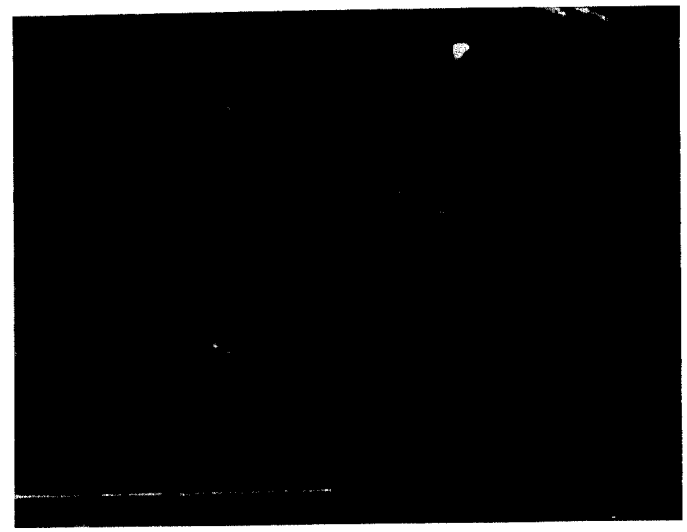

The descriptions of preferred embodiments as described by FIGS. 1A, 1B, 2, 3, 4, 5A, 5B and Table 1 and references to pore size, % porosity, surface area, resistivity, etc. are illustrative of the invention as a whole and are not meant to limit the broadest scope of the invention. While in many applications of this invention, it might be necessary to minimize the reduction in pore size due to the effects of the metallized coatings which act to narrow somewhat the pores in the PTFE microstructure, in other cases regulation of coating deposition thickness can be an effective and further unique means of reducing pore size in PTFE microporous membranes from some 0.02 um to some 0.0002 um (2 Å) or less. FIG. 5A is a photomicrograph showing a non-metallized PTFE 0.02 um pore size membrane. FIG. 5B is a metallized nickel-plated membrane having 0.002 um (20 Å) effective pore size made from the 0.02 um pore size PTFE membrane.

It is well known in the art that plating disposition is non-uniform with respect to thickness. The coating tends to concentrate on projections and edges, depositing on recessed surfaces to a much lesser extent. It has been found that this plating phenomenon will tend to form pores in the PTFE microstructure which are narrower at the outermost surfaces and which tend to widen in the volume below the surface. An anisotropic microporous structure is quite useful in applications such as ultra-filtration where a key element is the availability of membranes having useful trans-membrane flux and separation characteristics. Useful ultra-filtration membranes having adequate flux characteristics at reasonable pressure drops are anisotropic.

posited samples were used for control. The object of the test was to determine the extent of wear due to the contact of the eraser with the metal-plated surfaces. The samples were placed under the weighted eraser and drawn through the eraser's pinch point. It was found that after only 1 pull the control sample showed wear, while the nickel-plated sample was pulled through 100 times and showed no signs of wear. The metal coating also passed a crease test and a filter bag blaster test. The crease test consisted of folding samples in a sharp crease, and microscopically viewing the crease line for signs of wear. Metallized vacuum deposited samples were used for control. The vacuum deposited metallized samples showed wear after only 1 crease, the metallized-plated samples of the invention were creased 100 times without showing signs of wear.

The filter bag blaster test is an abrasion test which utilizes abrasive dust to blast the sample surface. Non-metallized samples of the same construction as metallized plated samples were used for comparative testing. The abrasion durability on the metallized plated samples were found to be equal to or better than the non-metallized.

Also, a 72-hour soak of the coated membranes in a 47% KOH solution revealed no visible flaking or leaching of nickel or organic deterioration.

Importantly, it was found that the nickel coating rendered the microporous PTFE substrate hydrophilic, a surprising feature in view of the strongly hydrophobic character of the uncoated PTFE material. This feature allows the coated membrane shown in FIG. 2 to be easily saturated with plain water, without the need for aqueous surfactants and/or excessive pressures. Table 1 shows testing details.

TABLE 1

The values in Table 1 are to be considered illustrative and as not circumscribing the invention in its broadest scope.

| | SAMPLE DESIGNATION | A | A1 | B | B1 | C | C1 |
|---|---|---|---|---|---|---|---|
| | Coating | Nickel | NON | Nickel | NON | Nickel | NON |
| | Manufacturer's Designation | 3B1-1 | 3B1-1 | 1C.1 (.8/40F)M | 1C.1 (.8/40F) | 1C.1* (40F) | 1C.1* (40F) |
| | Pore Size um | 0.02 | 0.02 | 15 | 15 | 15 | 15 |
| | Porosity % by Volume | 50 | 50 | 98 | 98 | 98 | 98 |
| | Permeability Air: | | | | | | |
| | Frazier No. CFM/ft2/0.5 in. H2O | — | — | 17 | 40 | 8.5 | 25.0 |
| A | Gurley Seconds | 400 | 520 | — | — | — | — |
| | Permeability Water: | | | | | | |
| | cc/min. approx. 5 in. Hg | — | — | 2000 | 240 | 158** | 56** |
| | Water Entry Pressure (psi) | — | — | — | 0.23 | 0.04 | 0.11 |
| B | Bubble Point | 60 | 58 | 0.5 | 0.5 | 1.2 | 0.8 |
| | Resistivity Ohms: | | | | | | |
| | Surface ohms/inch | 0.5 | $10^{14}$ | 200 | $10^{14}$ | 50 | $10^{14}$ |
| | Volume ohms/thickness | $10^{12}$ | $10^{12}$ | 2 | $10^{12}$ | 2 | $10^{12}$ |
| | Durability | | | | | | |
| C | Eraser | Passed | Passed | Passed | Passed | Passed | Passed |
| D | Blaster | Passed | Passed | Passed | Passed | Passed | Passed |
| | Crease | Passed | Passed | Passed | Passed | Passed | Passed |

Notes:
A Gurley Seconds/ASTM D726-58 Method A
B Ethanol Bubble Point/ASTM
C Eraser Test: Abrasive test compares durability to a metal vacuum deposited sample by rubbing with eraser an equal number of times at equal pressure and observing wear.
D Blaster Test: Samples are pneumatically blasted with an abrasive dust at equal impingement velocities and frequency samples are visually inspected for abrasion and compared against metal vacuum deposited samples.
* ®Reemay
** Tested at 20.36 in. Hg.

The nickel coating on the article shown in FIGS. 1A, 1B, 2, 3, 4, 5A and 5B was found to be relatively durable as it did not flake or peel off when rubbed with a rubber eraser. The eraser test consists of a rubber eraser weighted down by a 1 kg gram weight. A 5 gram weight was used for sample 2. Metallized vacuum de- Table 1 also represents data on a layered article made in accordance with the present invention, namely item no. C. The manufacturer's designations for the samples are included.

For coated laminate sample of item no. C, the porosities of the final coated article, as a fraction of the porosities of the uncoated laminate were greater than 0.5 indicating retention of a significant portion of the microporosity of the uncoated laminates. The ratio of the resistivity per unit length measured along the coated PTFE surface divided by the resistivity per unit length through the coated laminate thickness averaged greater than about 20 for sample C1, indicating good subsurface interporous coatings. Average coated PTFE layer pore size for sample C was less than about 15 um.

The method of tenaciously encapsulating the microporous PTFE membrane with continuous interporous metal coatings involves a series of sequential steps including cleaning the microporous PTFE membrane through immersion in a liquid solution; displacing, coating, and filling the membrane with an aqueous surfactant; displacing, concentrating, and depositing the membrane by immersion in an aqueous palladium/tin activator solution; immersing the activated membrane in an accelerator to substantially displace the tin portion of the palladium/tin activator; immersing the membrane in a water wash, to displace at least a portion of the accelerator; and a final step of electroless plating of the microporous PTFE membrane. In the process of the present invention following the initial cleaning step, the microstructure of nodes and interconnected fibrils is coated with a water-surfactant solution or a suitable water soluble organic solvent (e.g. acetone, isopropanol, etc.) which fills the interior microporous spaces. The time required to saturate the PTFE microstructure is largely dependent on the size of the pores. Pressurized flow could be used to ensure maximum pore space filling and coating of the various nodes and fibrils and shorten saturation times.

After imbibing the microporous material, the aqueous surfactant is replaced by another solution, always keeping the membrane completely filled. This displacement effected by the later solution may result in some circumstances in a total substitution of the original aqueous liquid. Varying the amount of time, concentration, and pressure controls the degree of displacement. Following the activation step, to be described hereinafter, the aqueous solution covering the PTFE membrane is replaced with an electroless plating solution. The resultant coating will surround the interior and exterior surfaces of the substrate with a durable coating while retaining a substantial fraction of the original porosity. The liquid-liquid displacement has been found to be particularly effective in allowing the electroless plating solution to fill the voids in the microporous material.

Therefore, in accordance with the present invention, the process for forming interporous coatings of a conductive metal on a microporous PTFE substrate includes as a first step the cleaning of the substrate. As embodied herein, the 4" by 4" samples listed in Table 1 were cut and soaked 1.5 to 10 minutes in anhydrous acetone.

Further in accordance with the present invention, the cleaned samples were saturated with an aqueous surfactant solution. As embodied herein, the cleaned samples were soaked for 5-10 minutes in a solution of Macuplex Preactivator PA-3 (a surfactant activator manufactured and sold by McDermid Inc., Brookside Road, Waterbury, CT), methanol, and distilled water. The samples were then given a final water rinse. Care was taken not to contaminate the cleaned and saturated samples.

In accordance with the invention, the next step is activating the substrate. As embodied herein, the activation step includes a series of substeps. The substrate was soaked in Shipley Cuposit Catalyst 9F (tin, palladium salt and hydrochloric acid) for 5-20 minutes followed by a water rinse. Thereafter, and as the final activation substep the substrates were soaked in Shipley Cuposit Accelerator 19 (hydrochloric acid) for 10-40 minutes. The final substep acts to remove substantially all of the tin from the tin-paladium catalyst within the microporous substrate. Ammonium hydroxide could also be used in this substep.

In accordance with the invention, at least a portion of the accelerator remaining in the activated substrate is displaced using an aqueous solution. As embodied herein, a water rinse is used.

In accordance with the invention, the next step in the coating process includes plating the activated substrates using an electroless plating solution. As embodied herein, the activated substrates were freely floated in a solution of Shipley Niposit 468 (electroless nickel plating system manufactured and sold by the Shipley Company, 2300 Washington Street, Newton, Massachusetts 02162) contained in a glass beaker. The plating solution was maintained at 150° F. and adjusted to a pH of 7.2 using ammonium hydroxide. The substrates were stirred with a stirring bar magnet but were not allowed to contact the stirring bar. Under these conditions, plating commenced immediately and was concluded in all cases within 5 minutes; The thickness of the plating surrounding the nodes and fibrils is about 10-1000A. Following plating, the substrates were rinsed in water and allowed to dry before making the recorded porosity and conductivity measurements.

Experimental plating has included plating electroless nickel and copper on GORE-TEX Membrane materials from 50 um pore size to 0.02 um pore size. The thickness of plated materials range from a fraction of a mil to 0.125 greater thicknesses. Plating on just one side, both sides, and through plating have been achieved. Microporous PTFE Sheets, tubes, rods, and PTFE insulated electrical wire and cables, have been successfully plated.

Certain possible applications of the metal-plated PTFE micro-structure are:

(1) As a cleanable precipitator collector plate, where the material's conductivity would allow an electrical gradient to be established and consequent collection of particulate on the microporous surface without particle penetration. The material's permeability and flexibility would allow it to be cleaned;

(2) As a electrically conductive grounding and shielding material which is flexible and uses a minimum of metal. (This would be important if precious metals are needed.) Also, the combination of the dielectric properties of PTFE Membranes, in conjunction with the plating, may have surprising electrical properties. (Flexible and formable printer circuit boards, etc.);

(3) For battery and fuel cell applications;

(4) As a catalytic material (poison gas suit, filter bags for $NO_x$ and $SO_x$ removal, etc.);

(5) As flow through electrode and electrolite systems;

(6) As a water wettable membrane filtration material;

(7) In conductive garments (protective clothing, etc);

(8) Conductive filter bags and other conductive filtration materials;

(9) Instrumentation applications (particle counter, anemometer, etc.);
(10) Bacteriological and viral sterilization through chemical and electrocution means;
(11) In electrofiltration applications; and
(12) Microwave applications, antenna systems, strip lines, etc.

It will be apparent to those skilled in the art that various modifications and variations could be made to the metal-plated PTFE articles and method of manufacture without departing from the scope or spirit of the invention.

What is claimed is:

1. A metal-coated article wherein said article is a microporous polytetrafluoroethylene tube having a micro-structure of nodes interconnected by fibrils, said metal coating substantially encapsulating at least some of the individual nodes and fibrils, the tube having inner and outer surfaces, said tube also being flexible and electrically conductive through at least a portion of the microporous structure while retaining porosity.

2. The article as in claim 1 wherein the metal coating has encapsulated the fibrils and nodes of a portion of said inner surface, penetrating into the depth but not through to the outside surface.

3. The article as in claim 1 wherein the metal coating has encapsulated the fibrils and nodes of a portion of said outer surface, penetrating into the depth but not through to the inside surface.

4. The article as in claim 1 wherein the metal coating has encapsulated the fibrils and nodes of portions of both of said inner and outer surfaces of the tubular membrane but has not penetrated throughout its volume.

5. The article as in claim 1 wherein the metal coating has encapsulated the fibrils and nodes of portions of both of said inner and outer surfaces of the tubular membrane and has penetrated through its volume.

6. The article as in claim 1 wherein the metal-coated surface area is microporous and hydrophilic and any nonmetal-coated volume portion is hydrophobic.

7. A metal-coated microporous article comprising:
   (a) a microporous polytetrafluoroethylene substrate having a microstructure of nodes interconnected by fibrils, and
   (b) a continuous interporous coating of conductive metal, said metal coating substantially encapsulating at least some of the individual nodes and fibrils, wherein at least one surface of the article is electrically conductive and wherein at least a portion of volume of the article beneath said one surface is electrically conductive while returning porosity.

8. The article as in claim 7 wherein the metal-coated volume portion is hydrophilic and any non metal-coated volume portion is hydrophobic.

9. The article as in claim 7 wherein the article is a sheet and is conductive along both sheet surfaces and through the entire sheet thickness.

10. The sheet as in claim 9 wherein the ratio of the resistivity per unit length along a sheet surface divided by the resistivity per unit length through the sheet thickness is greater than about 0.1.

11. The sheet as in claim 7 or 9 wherein the ratio of the permeability of the article divided by the permeability of the uncoated substrate is greater than about 0.1.

12. The article as in claim 7 or 9 wherein the average pore size is less than about 100 um.

13. The article as in claim 7 or 9 which is flexible.

14. The article as in claim 7 or 9 which has high abrasion resistance.

15. The article as in claim 7 or 9 wherein the metal-coated volume portion is hydrophilic.

16. The article as in claim 7 or 9 having an average bulk density of less than about 10 gm/cc.

17. The sheet as in claim 7 or 9 wherein the permeability of the uncoated substrate is between about less than 0.1 fn and 100 fn, permeability being measured on the fraziometer.

18. The article as in claim 7 or 9 wherein the metal is selected from a group consisting of nickel, copper, silver, gold, platinum, or rhodium and the thickness of the metal coating surrounding the nodes and fibrils is about 10 to 1000 Å.

19. The article as in claim 7 or 9 wherein the effective surface area of said coated volume is greater than 1 m2/gram.

20. A layered article comprising:
   (a) a microporous polytetrafluoroethylene first layer having a microstructure of nodes interconnected by fibrils and a continuous interporous coating of conductive metal, said metal coating substantially encapsulating at least some of the individual nodes and fibrils, said first layer also being flexible and electrically conductive along at least one layer surface and also from said one surface along a path perpendicular to said one surface through at least a portion of the first layer thickness while retaining porosity, said first layer also having a bulk density less than about 10 g.p.m./cc; and
   (b) a second layer contacting said first layer at the surface opposite said one surface.

21. The article as in claim 7, 20 or 1 wherein the coated metal thickness is nonuniform throughout the microporous structure, said micropores having a smaller cross-sectional flow area at said conductive surface compared to the cross-sectional flow area in said volume beneath said conductive surfaces.

22. The article as in claim 20 wherein said second layer is flexible.

23. The article as in claim 20 wherein said second layer is conductive along its surface opposite said first layer.

24. The article as in claim 20 wherein said second layer is conductive through the second layer thickness.

25. The article as in claim 20 wherein said second layer is permeable.

26. The article as in claim 20 wherein said second layer is hydrophilic.

27. The article as in claim 20, wherein said second layer is hydrophobic.

28. The article as in claim 20 wherein the average pore size of the coated first layer is less than about 50 um.

29. The article as in claim 20 wherein said first layer is a thin membrane conductive through its total thickness and having a thickness of about 0.5 mils, and said second layer is a porous, fabric backing with a thickness of about 5 mils, and wherein said fabric backing is coated with a conductive metal, said fabric backing layer being conductive along a second layer surface.

30. The article as in claim 29 wherein the ratio of the resistivity per unit length along the first layer surface divided by the resistivity per unit length through the combined first and second layer thicknesses is greater than about 0.1.

31. The article as in claim 29 wherein the metal coating on said fabric backing surrounds the individual fibers and the fabric backing is conductive through the entire second layer thickness.

32. The article as in claim 29 or 31 wherein the ratio of the permeability of the uncoated article divided by the permeability of the coating article is greater than about 0.1 fn.

33. The article as in claim 31 wherein the conductive metal coating on said membrane and said fabric backing is selected from a group consisting of nickel, copper, silver, gold, platinum, or rhodium.

* * * * *